(12) United States Patent
Sugaya et al.

(10) Patent No.: US 9,054,140 B2
(45) Date of Patent: Jun. 9, 2015

(54) SUBSTRATE HOLDER SYSTEM, SUBSTRATE HOLDER, FASTENING MECHANISM, SUBSTRATE BONDING APPARATUS AND METHOD FOR MANUFACTURING DEVICES

(75) Inventors: Isao Sugaya, Kawasaki (JP); Junichi Chonan, Fukaya (JP); Hidehiro Maeda, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/354,570

(22) Filed: Jan. 20, 2012

(65) Prior Publication Data
US 2012/0205024 A1 Aug. 16, 2012

Related U.S. Application Data

(63) Continuation of application No. PCT/JP2010/004659, filed on Jul. 21, 2010.

(30) Foreign Application Priority Data

Jul. 21, 2009 (JP) ................................. 2009-170513
Nov. 4, 2009 (JP) ................................. 2009-253438

(51) Int. Cl.
*B29C 65/78* (2006.01)
*H01L 21/67* (2006.01)
(Continued)

(52) U.S. Cl.
CPC ........ *H01L 21/67092* (2013.01); *H01L 21/187* (2013.01); *H01L 21/6833* (2013.01)

(58) Field of Classification Search
CPC .......................... H01L 21/187; H01L 21/6833
USPC ............ 156/60, 538, 556, 580; 438/455, 456; 269/37
See application file for complete search history.

(56) References Cited

U.S. PATENT DOCUMENTS 4,038,599 A 7/1977 Bove et al.
5,133,491 A * 7/1992 Correll et al. ..................... 225/1
(Continued)

FOREIGN PATENT DOCUMENTS

CN 1445588 A 10/2003
CN 1936678 A 3/2007
(Continued)

OTHER PUBLICATIONS

International Search Report, from the Japanese Patent Office in corresponding PCT Application No. PCT/JP2010/004659, mailed Oct. 26, 2010.
(Continued)

*Primary Examiner* — Philip Tucker
*Assistant Examiner* — John Blades
(74) *Attorney, Agent, or Firm* — Finnegan, Henderson, Farabow, Garrett & Dunner, LLP

(57) ABSTRACT

Provided is a substrate holder system comprising a first substrate holder that holds a first substrate; an engaging member provided on the first substrate holder; a second substrate holder that holds a second substrate and can, together with the first substrate holder, sandwich the first substrate and the second substrate; an engagement receiving member that is provided on the second substrate holder and engages with the engaging member; and a dust restricting means for restricting generation of dust caused by the engagement of the engaging member and the engagement receiving member.

30 Claims, 17 Drawing Sheets

(51) Int. Cl.
*H01L 21/18* (2006.01)
*H01L 21/683* (2006.01)

(56) References Cited

U.S. PATENT DOCUMENTS

| | | | |
|---|---|---|---|
| 7,245,350 B2* | 7/2007 | Mochizuki et al. | 355/53 |
| 2003/0178468 A1* | 9/2003 | Lee et al. | 228/102 |
| 2005/0092816 A1 | 5/2005 | Lee et al. | |
| 2010/0206454 A1* | 8/2010 | Maeda et al. | 156/60 |

FOREIGN PATENT DOCUMENTS

| | | | |
|---|---|---|---|
| CN | 101190724 A | 6/2008 | |
| JP | 51-78990 B2 | 7/1976 | |
| JP | 02-126648 * | 5/1990 | H01L 21/68 |
| JP | H 02-126648 A | 5/1990 | |
| JP | H8-53186 | 2/1996 | |
| JP | 11-261000 | 9/1999 | |
| JP | 2005-251972 | 9/2005 | |
| JP | 2005-339706 | 12/2005 | |
| JP | 2007-115978 | 5/2007 | |
| JP | 2008-87847 | 4/2008 | |
| JP | 2008140986 * | 6/2008 | B65D 21/02 |
| WO | WO 2009/057710 A1 | 5/2009 | |
| WO | WO 2009/057710 A1 | 7/2009 | |

OTHER PUBLICATIONS

Written Opinion of the International Searching Authority in corresponding International Application No. PCT/JP2010/004659 mailed Oct. 26, 2010.
Office Action corresponding to Chinese Application No. 2010-80041652.X, issued Feb. 21, 2014.
Office Action corresponding to Chinese Application No. 2010-80041623.3, issued Mar. 11, 2014.
Office Action issued by the State Intellectual Property Office of People's Republic of China in counterpart Application No. 201080041623.3 issued on Aug. 21, 2014, and English translation thereof.
Office Action corresponding to Japanese Application No. 2011-523552, issued Apr. 22, 2014.
Office Action issued by the State Intellectual Property Office of People's Republic of China in counterpart Application No. 201080041652.X issued on Nov. 21,2014, and English translation thereof.
Office Action issued by the Japanese Patent Office in counterpart Application No. 2011-523552 on Dec. 24,2014, and English translation thereof.

* cited by examiner

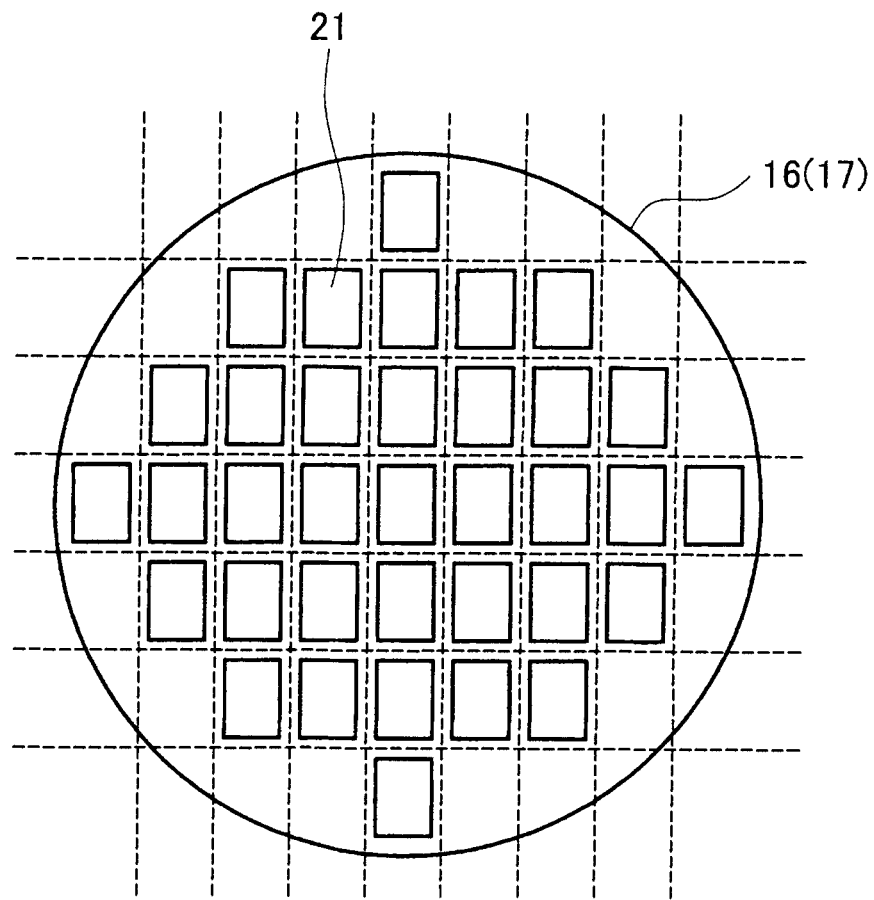
F I G . 2

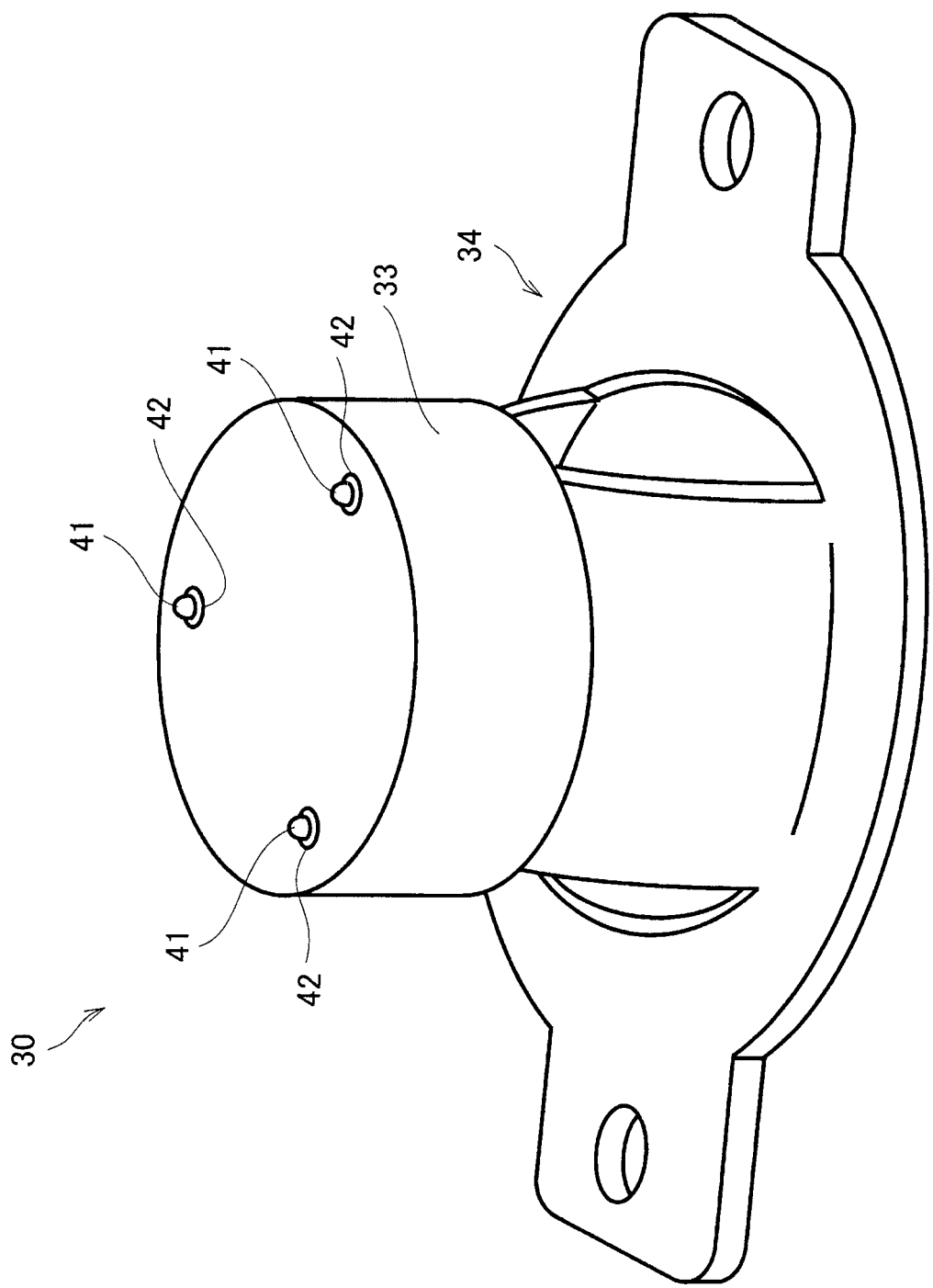
F I G. 12

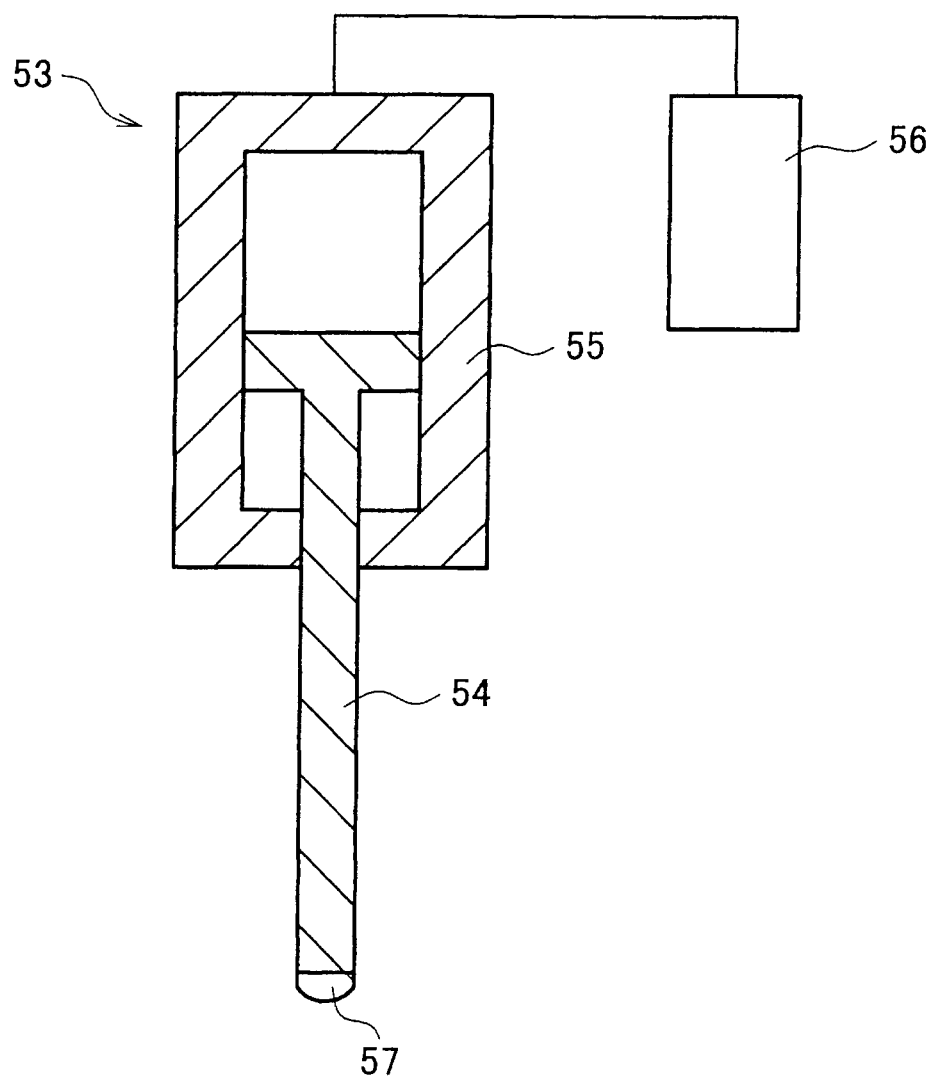
F I G. 15

SUBSTRATE HOLDER SYSTEM, SUBSTRATE HOLDER, FASTENING MECHANISM, SUBSTRATE BONDING APPARATUS AND METHOD FOR MANUFACTURING DEVICES

CROSS REFERENCES TO RELATED APPLICATIONS

This application is a continuation application of PCT International Application No. PCT/JP2010/004659 filed Jul. 21, 2010, which claims priority to Japanese Patent Application Nos. 2009-253438 filed on Nov. 4, 2009 and 2009-170513 filed on Jul. 21, 2009. The disclosure of the above-referenced applications is expressly incorporated herein by reference in its entirety.

BACKGROUND

1. Technical Field

The present invention relates to a substrate holder system, a substrate bonding apparatus, and a device manufacturing method.

2. Background Art

As shown in Japanese Patent Application Publication No. H11-261000, Japanese Patent Application Publication No. 2005-251972, and Japanese Patent Application Publication No. 2007-115978, a known layered semiconductor apparatus is formed by layering semiconductor substrates that each have elements, circuits, and the like formed thereon. When layering the semiconductor substrates, a pair of semiconductor substrates supported by substrate holders are positioned with a degree of accuracy corresponding to the line width of the semiconductor circuits and then layered, after which the entirety of each substrate is heated and pressurized to achieve bonding. At this time, a positioning apparatus that fixes the position of the pair of semiconductor substrates and a heating and pressurizing apparatus that realizes the permanent bonding via pressurization and heating are used.

When two semiconductor substrates are layered, if even a small amount of dust is trapped between the semiconductor circuit regions facing each other, the circuit operations becomes unacceptable. Furthermore, this can lead to localized occurrences of insufficient pressurization and heating, resulting in insufficient bonding strength. The semiconductor processing is generally performed within a clean room, but the apparatuses that handle the semiconductor substrates include various components whose operations, such as diving, sliding, or flowing, generate dust. One such component is a substrate holder. In the positioning apparatus, for example, when substrate holders respectively holding semiconductor substrates are integrated to form a layered semiconductor in a sandwiched state, it is necessary to use a fixing mechanism to fix the substrate holders to each other. The contact locations in this fixing mechanism generate dust. Accordingly, a substrate holder fixing mechanism is desired that can sufficiently restrict the dust.

SUMMARY

Therefore, it is an object of an aspect of the innovations herein to provide a substrate holder system, a substrate bonding apparatus, and a device manufacturing method, which are capable of overcoming the above drawbacks accompanying the related art. The above and other objects can be achieved by combinations described in the independent claims. The dependent claims define further advantageous and exemplary combinations of the innovations herein.

According to a first aspect of the present invention, provided is a substrate holder system comprising a first substrate holder that holds a first substrate; an engaging member provided on the first substrate holder; a second substrate holder that holds a second substrate and can, together with the first substrate holder, sandwich the first substrate and the second substrate; an engagement receiving member that is provided on the second substrate holder and engages with the engaging member; and a dust restricting means for restricting generation of dust caused by the engagement of the engaging member and the engagement receiving member.

According to a second aspect of the present invention, provided is a substrate holder comprising a holder body that holds a first substrate; a fixing section that fixes the first substrate held by the holder body and a second substrate to be bonded to the first substrate in a stacked state; and a dust restricting means that restricts generation of dust caused by the fixing of the fixing section.

According to a third aspect of the present invention, provided is a fixing mechanism comprising a fixing section that fixes a first substrate and a second substrate, which is to be bonded to the first substrate, in a stacked state; and a dust restricting section that restricts generation of dust due to the fixing by the fixing section.

According to a fourth aspect of the present invention, provided is a substrate bonding apparatus comprising a holder body that holds a first substrate; a fixing section that fixes the first substrate held by the holder body and a second substrate, which is to be bonded to the first substrate, in a stacked state; a dust restricting means that restricts generation of dust due to the fixing by the fixing section; and a bonding section that bonds the first substrate held by the holder body and the second substrate to each other.

According to a fifth aspect of the present invention, provided is a substrate bonding apparatus comprising a fixing section that fixes a first substrate and a second substrate in a stacked state; a dust restricting means that restricts generation of dust due to the fixing by the fixing section; and a bonding section that bonds the first substrate and the second substrate to each other.

According to a sixth aspect of the present invention, provided is a device manufacturing method comprising manufacturing a device by stacking a first substrate and a second substrate, comprising using a substrate holder including a holder body holding a first substrate, a fixing section that fixes the first substrate held by the holder body and the second substrate to be bonded to the first substrate in a stacked state, and a dust restricting means that restricts generation of dust due to the fixing by the fixing section, to mount the first substrate on the substrate holder; stack the second substrate on the first substrate mounted on the substrate holder; and fix the first substrate and the second substrate using the fixing section.

The summary clause does not necessarily describe all necessary features of the embodiments of the present invention. The present invention may also be a sub-combination of the features described above.

BRIEF DESCRIPTION OF THE DRAWINGS

FIG. 2 is a planar view schematically showing a semiconductor wafer.

FIG. 12 is a perspective view schematically showing an exemplary arrangement of spherical protrusions on an attracting element.

FIG. 15 is a cross-sectional view schematically showing the engagement control unit.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
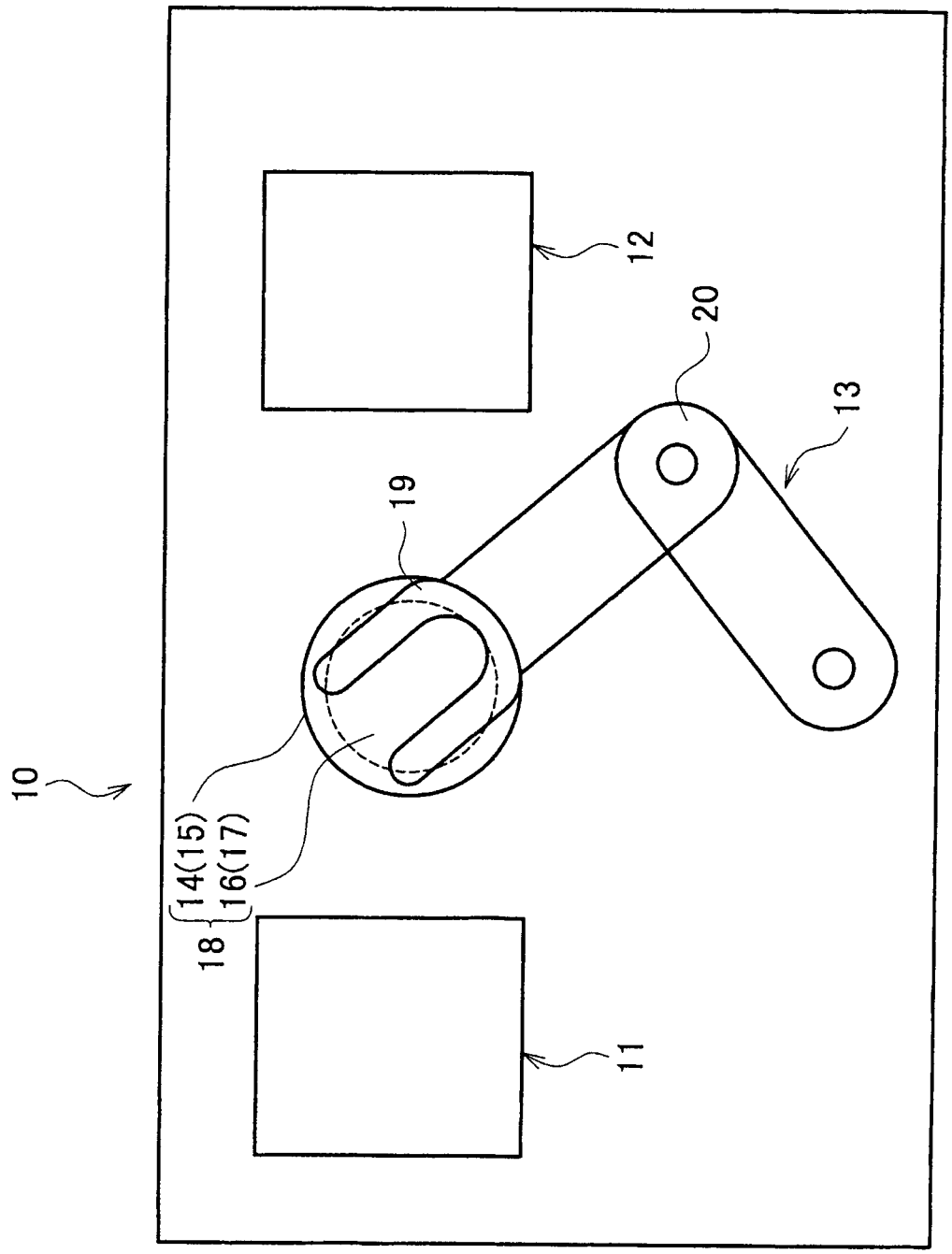
FIG. 1 schematically shows a substrate bonding apparatus.

FIG. 1 schematically shows a substrate bonding apparatus 10 according to a first embodiment. The substrate bonding apparatus 10 includes an alignment apparatus 11 that aligns a first substrate 16, which is a semiconductor wafer, with a second substrate 17, which is a semiconductor wafer to be layered on the first substrate 16. The substrate bonding apparatus 10 also includes a bonding apparatus 12 that bonds together the first substrate 16 and the second substrate 17 aligned by the alignment apparatus 11.

The first substrate 16 is held by the first substrate holder 14, and the second substrate 17 is held by the second substrate holder 15. In the alignment apparatus 11, when the first substrate 16 and the second substrate 17 are aligned, the first substrate holder 14 and the second substrate holder 15 sandwich the first substrate 16 and the second substrate 17 to form these substrates integrally, thereby forming the substrate holder pair 18. A detailed structure of the substrate holder pair 18 is described further below.

The substrate bonding apparatus 10 further includes a transport apparatus 13 that transports the substrate holder pair 18 integrated by the alignment apparatus 11 to the bonding apparatus 12. The transport apparatus 13 can also transport a semiconductor wafer or a single substrate holder between apparatuses. The transport apparatus 13 includes a gripping section 19 that grips a gripping target such as the substrate holder pair 18, and an arm portion 20 that moves the gripping target to a prescribed position via rotating and extending/contracting movement.

FIG. 2 is a planar view schematically showing a semiconductor wafer according to the present embodiment. The first substrate 16 and the second substrate 17, which are semiconductor wafers, are each formed of a circular thin board made of single-crystal silicon, and each have one surface on which a plurality of circuit regions 21 are formed. The circuit regions 21 are partitioned into a matrix, and circuit elements such as transistors, resistors, and capacitors are formed therein. The circuit elements are formed using mainly lithography techniques such as thin film formation, etching, or impurity diffusion. Alignment marks are provided within each of the circuit regions 21. The alignment marks are indicators used to align the substrates with each other. The plurality of alignment marks provided on each of the first substrate 16 and the second substrate 17 have their set coordinate values stored independently and managed in a memory. The semiconductor wafers to be layered may be semiconductor wafers that have already been layered with other semiconductor wafers. In this case, the previously layered circuit layers preferably undergo a thinning process to remove unnecessary thickness.

Figure 3:
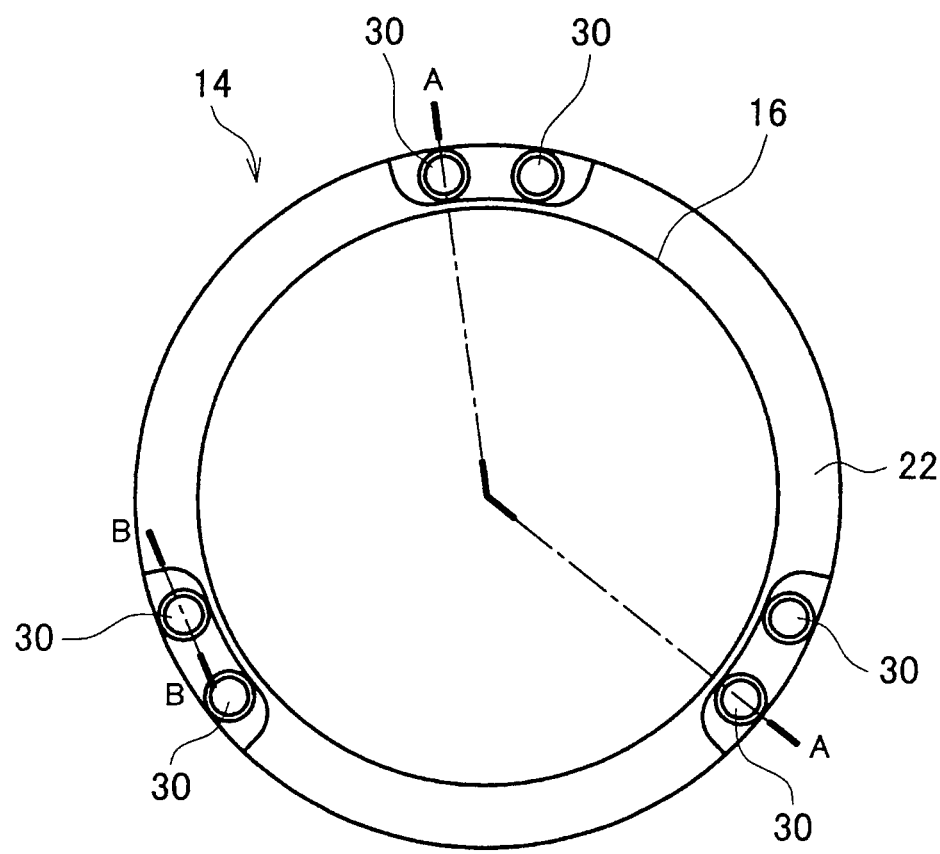
FIG. 3 is a planar view schematically showing the first substrate holder holding the first substrate.

FIG. 3 is a planar view schematically showing the first substrate holder 14 holding the first substrate 16. The first substrate holder 14 includes a holder body 22 and an attraction unit 30, and is shaped as a circular board with a diameter larger than that of the first substrate 16. The holder body 22 is formed integrally using a material with high rigidity such as ceramic or metal.

The holder body 22 has a region for holding the first substrate 16 on the surface thereof. This holding region is polished to be extremely flat. The holding of the first substrate 16 is achieved by adhesion that uses electrostatic force. Specifically, voltage is applied to an electrode embedded in the holder body 22, via a voltage application terminal provided on the back surface of the holder body 22, to cause a potential difference between the first substrate holder 14 and the first substrate 16, thereby adhering the first substrate 16 to the first substrate holder 14. The adhesion surface of the first substrate 16 is the surface opposite the surface on which the circuit regions 21 are provided.

The attraction unit 30 includes a plurality of peripheral regions, which are arranged further outward than the held first substrate 16, on the surface thereof that holds the first substrate 16. In the example shown in the drawings, sets that each include two attraction units 30 are arranged at intervals of 120 degrees to obtain a total of six attraction units 30. A more detailed configuration is described further below.

Figure 4:
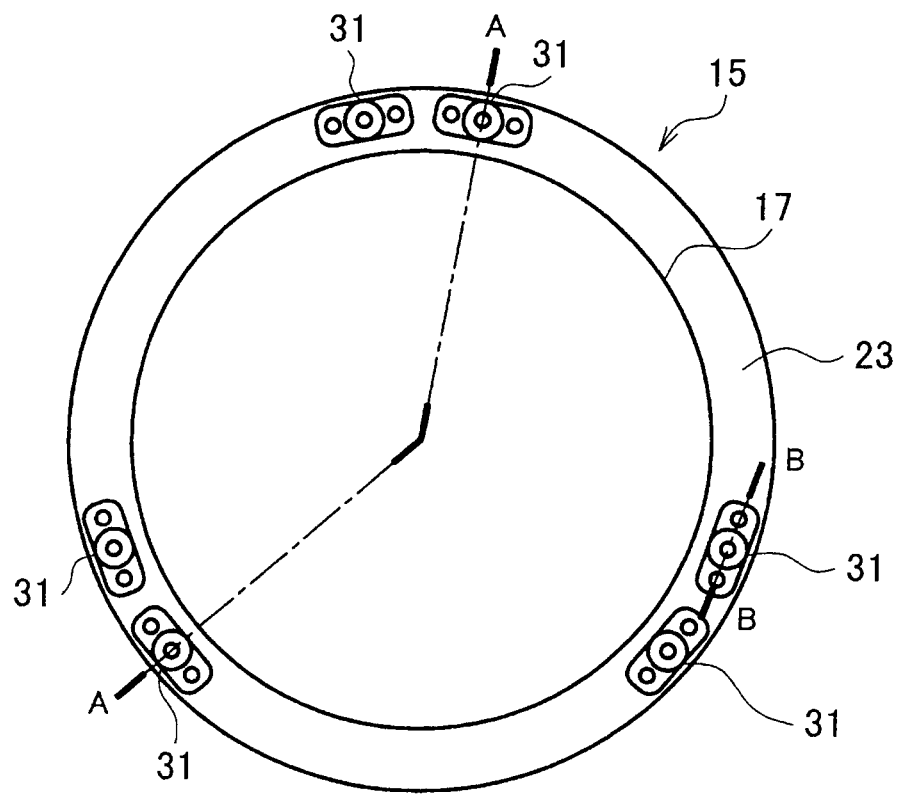
FIG. 4 is a planar view schematically showing the second substrate holder holding the second substrate.

FIG. 4 is a planar view schematically showing the second substrate holder 15 holding the second substrate 17. The second substrate holder 15 includes a holder body 23 and magnet units 31, and is shaped as a circular board with a diameter larger than that of the second substrate 17. The holder body 23 is formed integrally using a material with high rigidity such as ceramic or metal.

The holder body 23 has a region for holding the second substrate 17 on the surface thereof. This holding region is polished to be extremely flat. The holding of the second substrate 17 is achieved by adhesion that uses electrostatic force. Specifically, voltage is applied to an electrode embedded in the holder body 23, via a voltage application terminal provided on the back surface of the holder body 23, to cause a potential difference between the second substrate holder 15 and the second substrate 17, thereby adhering the second substrate 17 to the second substrate holder 15. The adhesion surface of the second substrate 17 is the surface opposite the surface on which the circuit regions 21 are provided.

The magnet unit 31 includes a plurality of peripheral regions, which are arranged further outward than the held second substrate 17, on the surface thereof that holds the second substrate 17. In the example shown in the drawings, sets that each include two magnet units 31 are arranged at intervals of 120 degrees to obtain a total of six magnet units 31.

The magnet units 31 are arranged to correspond respectively to the attraction units 30 of the first substrate holder 14. When the first substrate holder 14 holding the first substrate 16 and the second substrate 17 holding the second substrate holder 15 face each other and the attraction units 30 and magnet units 31 are operated, the first substrate 16 and the second substrate 17 can be fixed together in a stacked state. This resulting stacked state is the substrate holder pair 18. A more detailed configuration and the adhesion operation are described further below.

Figure 5:
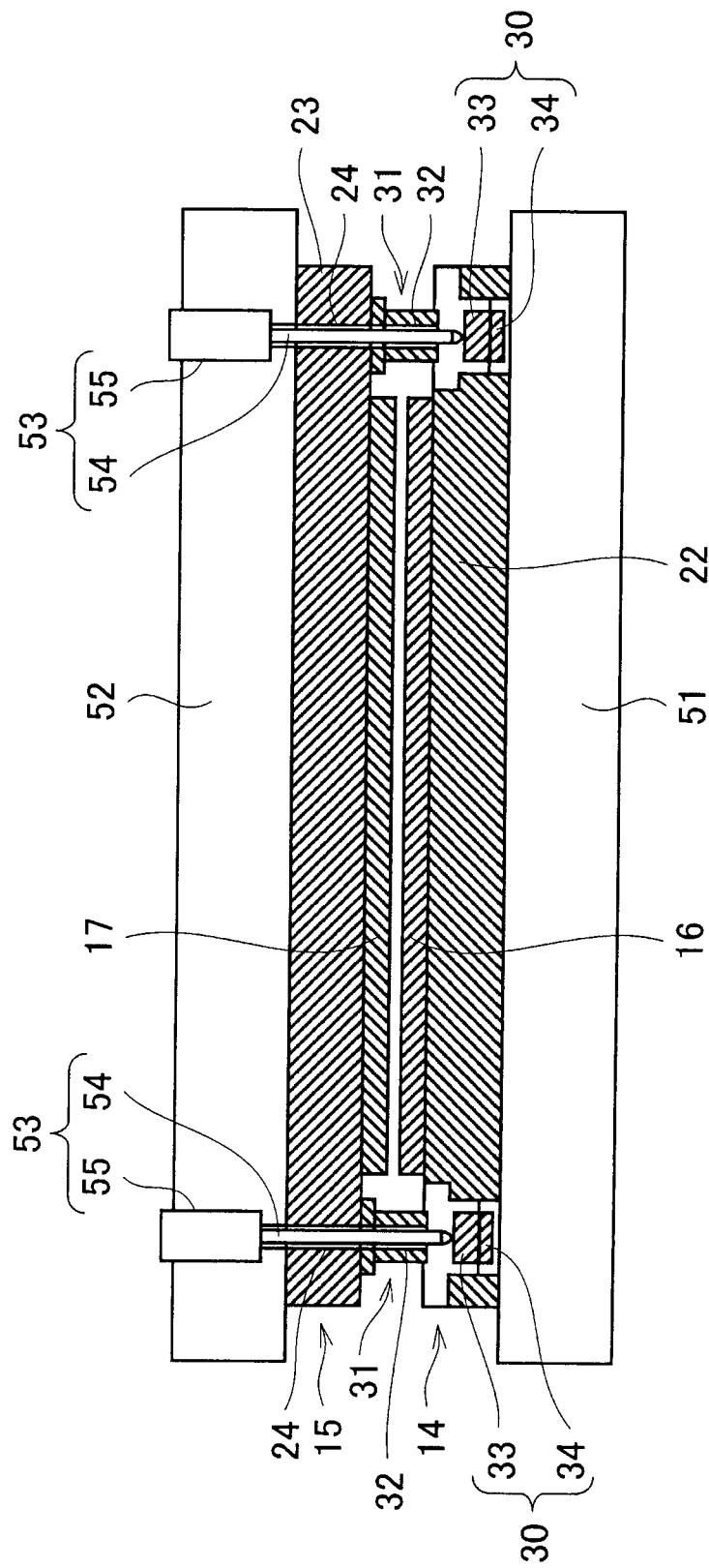
FIG. 5 is a cross-sectional view schematically showing a state immediately before the substrate holder pair is formed.

FIG. 5 is a cross-sectional view schematically showing a state immediately before the substrate holder pair 18 is formed by the alignment apparatus 11. Specifically, FIG. 5 is a cross-sectional view of a state in which the first substrate holder 14 holding the first substrate 16 is fixed to the first stage 51 of the alignment apparatus 11 by vacuum suction and the second substrate holder 15 holding the second substrate 17 is fixed to the second stage 52 of the alignment apparatus 11 by vacuum suction. In particular, the cross-sectional view is over the line A-A in FIGS. 3 and 4.

The first stage 51 can move the first substrate 16 relative to the second substrate 17, in a Z-axis direction that is the layering direction and X-axis and Y-axis directions that are each orthogonal to the Z-axis. The alignment apparatus 11 aligns the first substrate 16 and the second substrate 17, by using a first microscope arranged on the alignment apparatus 11 in a manner to be able to observe the first substrate 16 and a second microscope arranged on the alignment apparatus 11 in a manner to be able to observe the second substrate 17.

More specifically, each microscope is used to capture images of the alignment marks on each substrate serving as an observation target, and precise positions of the alignment marks are detected by performing image processing on the captured image data. The positional skew amount between corresponding alignment marks is then calculated and the first stage 51 is moved according to this positional skew amount, thereby aligning the first substrate 16 and the second substrate 17. In this way, each circuit region 21 of the first substrate 16 faces a corresponding circuit region 21 of the second substrate 17. The positional skew amount calculation may be performed using a global alignment technique, for example, in which the positional skew amount is statistically determined to have a minimum value when the plurality of alignment marks of the first substrate 16 overlap the plurality of alignment marks of the second substrate 17.

When aligning the first substrate 16 with the second substrate 17, i.e. when moving the first stage 51 in the XY-plane, a small gap is maintained between the first substrate 16 and the second substrate 17 such that the substrates do not contact each other. The second stage 52 includes a plurality of engagement control units 53, such that the attraction units 30 do not engage with the magnet units 31 when in this state.

Each engagement control unit 53 is mainly formed from a push pin 54, which is a member shaped as a pillar, and a cylinder portion 55 that drives the push pin 54. When at an extended position, the push pin 54 passes through a holder insertion hole 24 that is provided in the second substrate holder 15 and a magnet insertion hole 32 provided in the magnet unit 31 arranged to be aligned with the holder insertion hole 24, such that the tip of the push pin 54 protrudes beyond the magnet insertion hole 32. When at a storage position, a portion of the push pin 54 is stored within the cylinder portion 55, and is withdrawn from the insertion holes. In other words, the push pin 54 moves back and forth in the Z-axis direction within the insertion holes, according to the drive of the cylinder portion 55.

When the first substrate 16 and the second substrate 17 are to be moved relative to each other in the XY-plane, such as shown in FIG. 5, the push pins 54 are held at the extended position in contact with the top surfaces of the attraction units 30, thereby preventing the attraction units 30 from engaging with the magnet units 31. In other words, the attraction units 30 are formed by attracting elements 33 and flat springs 34 fixed to the attracting elements 33, but the push pins 54 press on the attracting elements 33 from above to restrict the elastic deformation of the flat springs 34, such that the attracting elements 33 do not engage with the magnet units 31 as a result of the elastic deformation of the flat springs 34.

The alignment of the first substrate 16 and the second substrate 17 by the alignment apparatus 11 is performed at a final fine adjustment stage in which the movement amount is such that the tips of the push pins 54 slide along the top surfaces of the attraction units 30. At other stages, such as an observation stage in which the alignment marks are observed by the microscopes, the first substrate 16 and the second substrate 17 are separated from each other by a large amount in the X-, Y-, and Z-axis directions, and therefore the attraction units 30 do not unexpectedly engage with the magnet units 31. Accordingly, the push pins 54 are held at the extended position when the magnetic force of the magnet units 31 is exerted on the attraction units 30 and engaging therebetween is to be prevented, and are held at the stored position at all other times.

Figure 6:
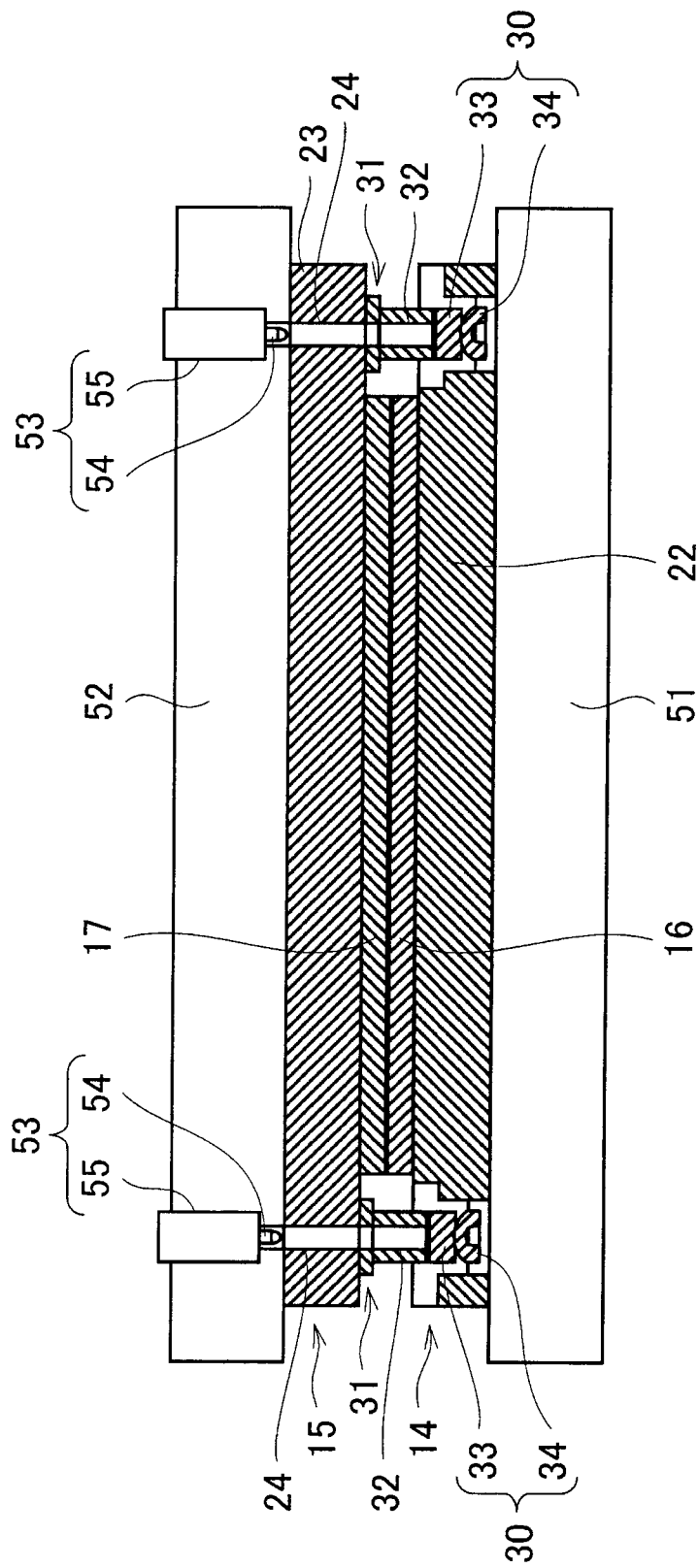
FIG. 6 is a cross-sectional view schematically showing a state immediately after formation of the substrate holder pair.

FIG. 6 is a cross-sectional view schematically showing a state immediately after formation of the substrate holder pair 18 by the alignment apparatus 11. Specifically, FIG. 6 shows a state in which the first stage 51 has been driven in the Z-axis direction from the state shown in FIG. 5, such that the surface of the first substrate 16 contacts the surface of the second substrate 17, the push pins 54 are held at the storage position, and the attraction units 30 and magnet units 31 are engaged.

During the process of transitioning from the state of FIG. 5 to the state of FIG. 6, the first substrate 16 and the second substrate 17 are aligned, and the magnet units 31, which are engaging members, are engaged with the attraction units 30, which are engagement receiving members. The first substrate holder 14 and the second substrate holder 15 are then formed integrally, thereby forming the substrate holder pair 18 as the substrate holder system.

The Z-axis direction is the direction of gravitational force in the alignment apparatus 11, and the first stage 51 is positioned below the second stage 52. Therefore, each surface is arranged from top to bottom, in the direction of the gravitational force, in the order of the second substrate 17 holding surface of the second substrate holder 15, the bonding surfaces of the second substrate 17 and the first substrate 16, and the first substrate 16 holding surface of the first substrate holder 14.

During the process of transitioning from the state of FIG. 5 to the state of FIG. 6, the movement of the push pins 54 to the storage position causes elastic deformation of the flat springs 34, and so the attraction units 30 engage with the magnet units 31. At this time, the engagement of the attracting elements 33 of attraction units 30 with the magnet units 31 is accompanied by a small impact. Therefore, at this time, the contact surfaces of the attracting elements 33 and the magnet units 31 in the gravitational force direction are set to be lower than the contact surfaces of the second substrate 17 and the first substrate 16. The contact surfaces of the attracting elements 33 and the magnet units 31 are preferably set to be lower than the first substrate 16 holding surface of the first substrate holder 14.

By setting such a positional relationship, even if dust is created and scattered by the impact of the engagement between the attraction units 30 and the magnet units 31, the dust can be expected to be pulled down by gravity and to not enter between the first substrate 16 and the second substrate 17. In other words, dust entering between the substrates causes problems in the circuit operation and creates insufficient bonding strength, but these problems can be expected to be avoided by adopting the positional relationship described above.

Furthermore, when the contact surfaces of the attracting elements 33 and the magnet units 31 are set below the first substrate 16 holding surface of the first substrate holder 14, dust can be prevented from becoming attached to these surfaces. As a result, the first substrate holder 14 can be kept in a clean state when used repeatedly, and there is no worry that dust will be trapped when the first substrate holder 14 is mounted on another first substrate 16. Accordingly, it can be expected that problems such as inclination of the first substrate 16 and bonding unevenness in the bonding apparatus 12 will be avoided.

After the substrate holder pair 18 is formed, the substrate holder pair 18 is released from the vacuum suction of the second stage 52, lifted up by the first stage 51, and transported to the bonding apparatus 12 by the transport apparatus 13. The transportation mechanism of the transport apparatus 13 and the bonding process of the bonding apparatus 12 are described further below.

Figure 7:
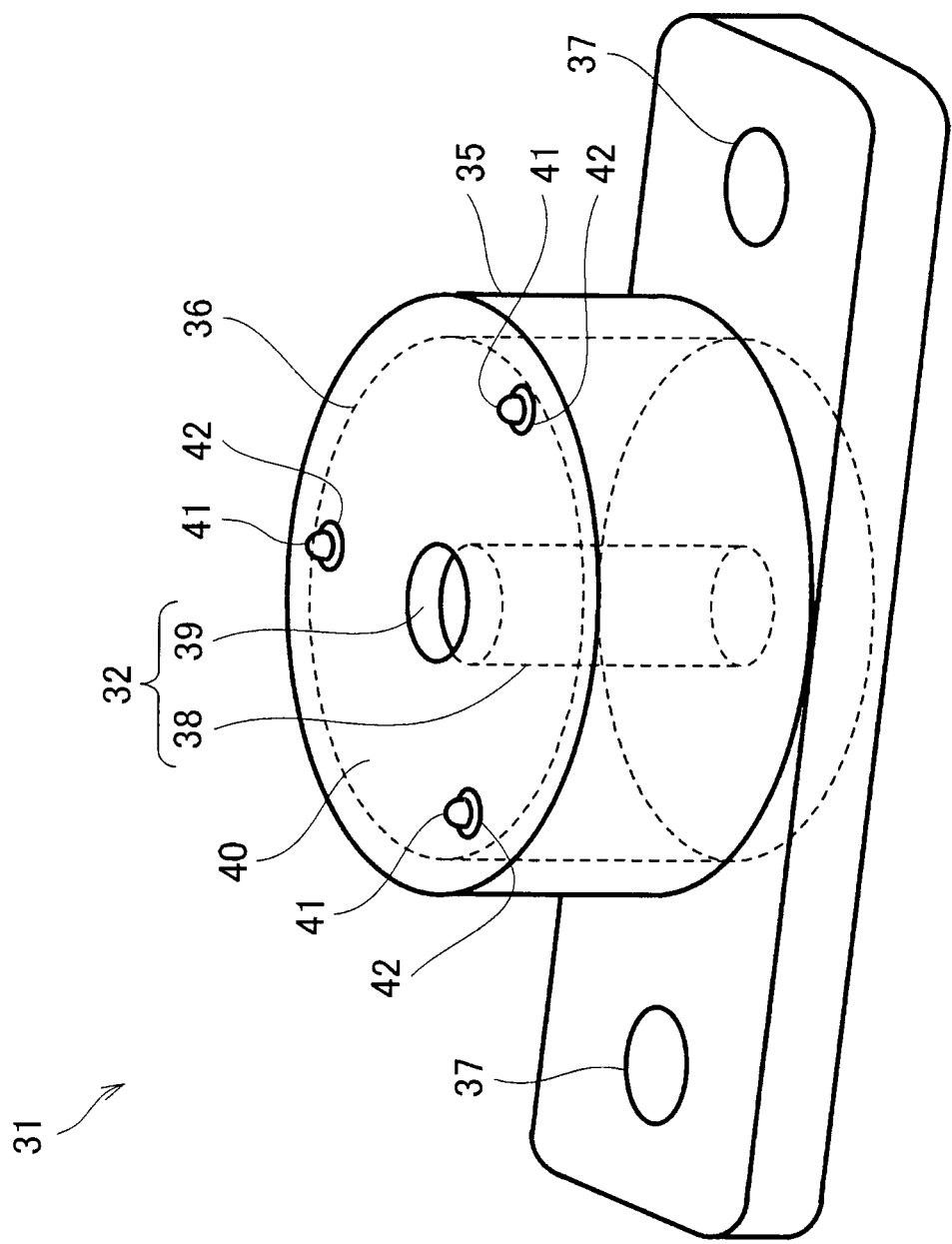
FIG. 7 is a perspective view schematically showing the magnet unit.

The following describes a configuration of the magnet unit 31. FIG. 7 is a perspective view schematically showing the magnet unit 31. The magnet unit 31 includes a magnet 36, a support section 35 housing the magnet 36, and a plurality of spherical protrusions 41.

The support section 35 includes a housing portion shaped as a circular cylinder that houses the magnet 36, and a threaded hole 37 through which passes a screw for fixing the support section 35 to the second substrate 17. The support section 35 is formed by carbon steel S25C, for example. The magnet 36 is a permanent magnet shaped as a circular pillar that can be inserted into the housing portion of the support section 35, and may have a magnetic force of approximately 8 N, for example. The central axis of the magnet 36 is provided with an insertion hole 38 into which is inserted a push pin 54, and an insertion hole 39 in series with the insertion hole 38 and into which the support section 35 is inserted. The magnet insertion hole 32 is formed by these two insertion holes.

The support section 35 includes a counterface surface 40 that faces the attracting element 33. At least three spherical protrusions 41 are embedded in the counterface surface 40. The spherical protrusions 41 are embedded and fixed by being pressed in fixing members 42, which are brass rings formed on the counterface surface 40, for example. As another example, the counterface surface 40 of the support section 35 may be machined using polishing, for example, such that the spherical protrusions 41 are formed integrally with the support section 35.

By forming the spherical protrusions 41 in this way, point contact can be achieved between the magnet unit 31 and the attracting element 33. In other words, since the virtual surface formed by the spherical protrusions 41 is the contact surface that contacts the attracting element 33, the surface area of the contact can be greatly reduced, and the occurrence of dust can be significantly restricted.

Figure 8:
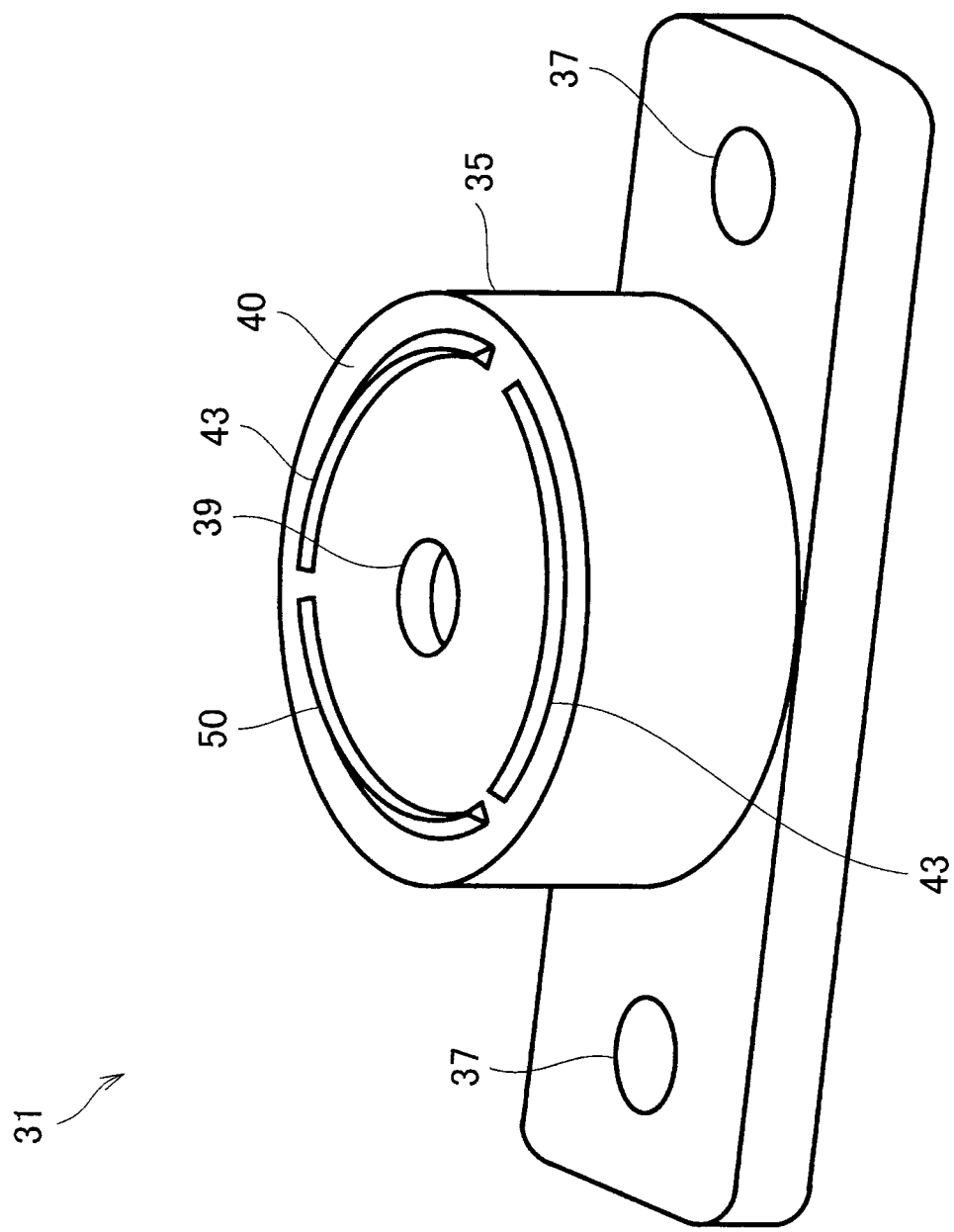
FIG. 8 is a perspective view schematically showing another example of a magnet unit.

FIG. 8 is a perspective view schematically showing another example of a magnet unit 31. This magnet unit 31 differs from the magnet unit 31 of FIG. 7 in that linear protrusions 50, which are protruding portions having triangular cross sections, are formed on the counterface surface 40. The linear protrusions 50 may be formed integrally with the support section 35 by machining the counterface surface 40 of the support section 35 via polishing, for example, or may be separate bodies attached to the counterface surface 40.

By forming the linear protrusions 50 in this way, line contact can be achieved between the magnet unit 31 and the attracting element 33. If the cross sections of the linear protrusions 50 are triangular, for example, the virtual surface formed by a straight line connecting the peak edges is the contact surface that contacts the attracting element 33, and therefore the surface area of the contact can be greatly reduced, and the occurrence of dust can be significantly restricted. The cross-sectional surface is not limited to a triangular shape, and any shape may be used that can achieve substantially linear contact. Furthermore, even if a small flat portion remains on the contact portion as a result of the polishing process, for example, this small flat portion is still acceptable as long as it can achieve substantially linear contact.

Figure 9:
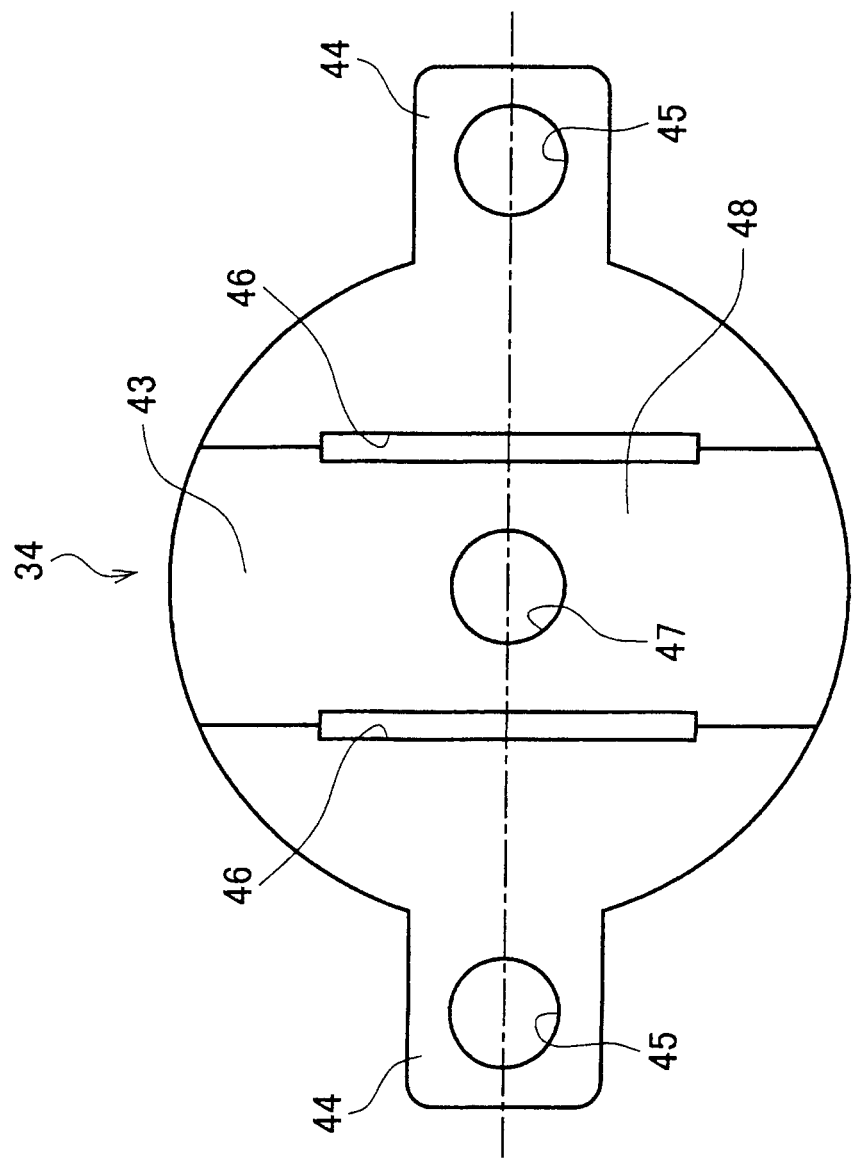
FIG. 9 is a planar view schematically showing a flat spring of an attraction unit.

The following describes a configuration of an attraction unit 30. FIG. 9 is a planar view schematically showing a flat spring 34 of an attraction unit 30.

The flat spring 34 is an elastic member having elasticity in a direction orthogonal to the holding surface of the second substrate holder 15 that holds the second substrate 17, and may be formed of a high-strength precipitation-hardening stainless steel, such as SUS 631. The flat spring 34 is formed by a central circular portion 43 and attaching sections 44 protruding therefrom as ears. The circular portion 43 has a diameter of 22 mm and a thickness of 0.1 mm.

A pair of slits 46 that extend in the same direction as each other are arranged in the circular portion 43 with an interval therebetween in a direction orthogonal to the extension direction. Each slit 46 is the same distance from the center of the circular portion 43. The two slits 46 form a band-shaped portion 48 in the central region of the circular portion 43. A through-hole 47 that fixes the attracting element 33 is formed in the band-shaped portion 48 at the center of the circular portion 43. Similarly, each attaching section 44 includes a threaded hole 45 through which passes a screw for fixing the flat spring 34 to the second substrate holder 15. The flat spring 34 is arranged in a peripheral region of the holder body 23, such that the two threaded holes 45 are oriented along a circumferential direction of the second substrate holder 15 and the extension direction of each slit 46 is oriented along the radial direction of the second substrate holder 15.

Figure 10:
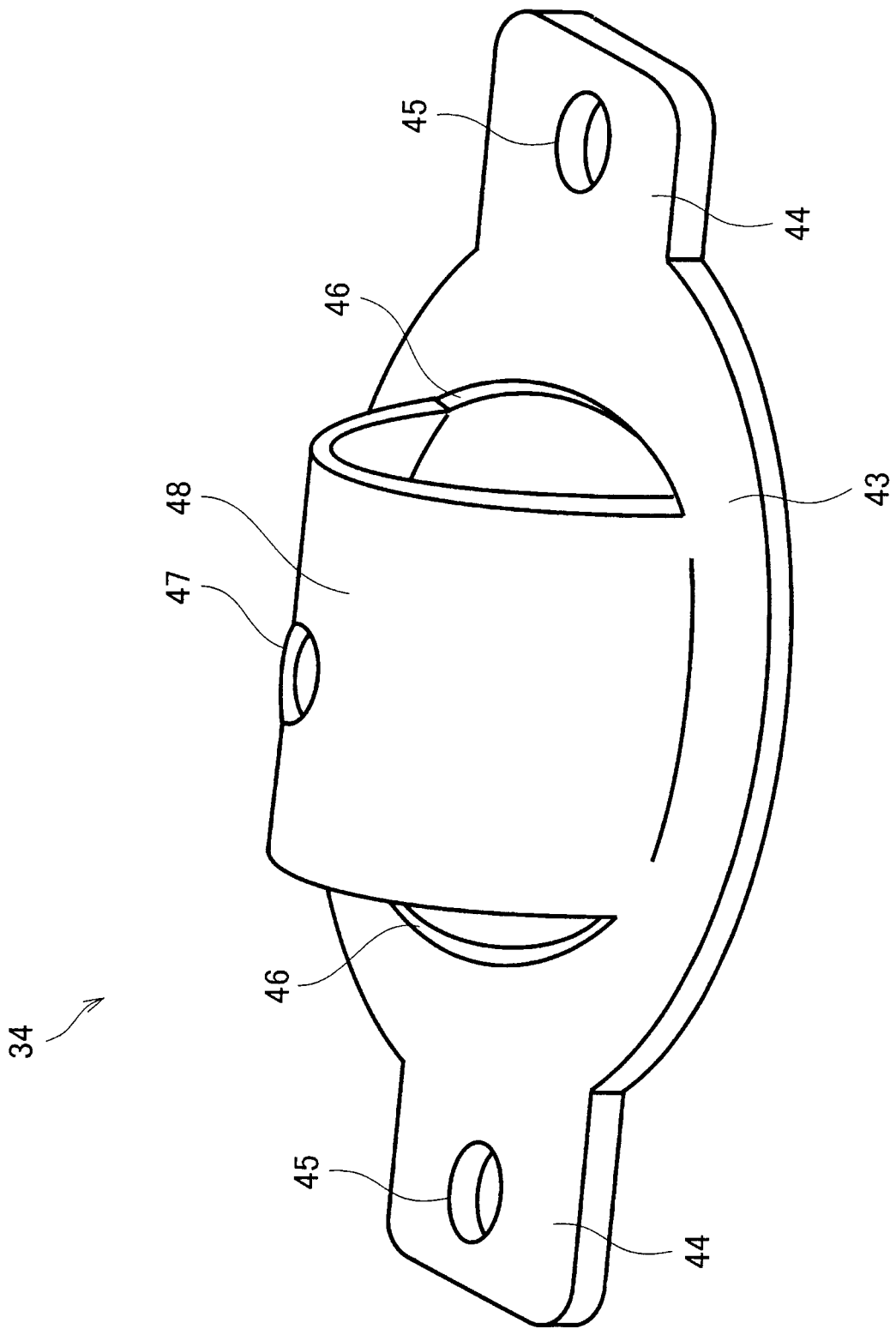
FIG. 10 is a perspective view schematically showing a state in which the flat spring is elastically deformed.

FIG. 10 is a perspective view schematically showing a state in which the flat spring 34 is elastically deformed. Specifically, FIG. 10 shows a state in which the attracting element 33 fixed to the flat spring 34 is engaged with the magnet unit 31 via attraction. It should be noted that the attracting element 33 is not shown in FIG. 10.

In the flat spring 34, as a result of the attracting element 33 being attracted to the magnet unit 31, the band-shaped portion 48 rises upward such that that the through-hole 47 becomes a peak, and the therefore two portions of the periphery of the circular portion 43 connected to the band-shaped portion 48 are deformed to draw closer to each other. At this time, the shapes of the openings in the slits 46 are deformed to allow for the above deformation.

Figure 11:
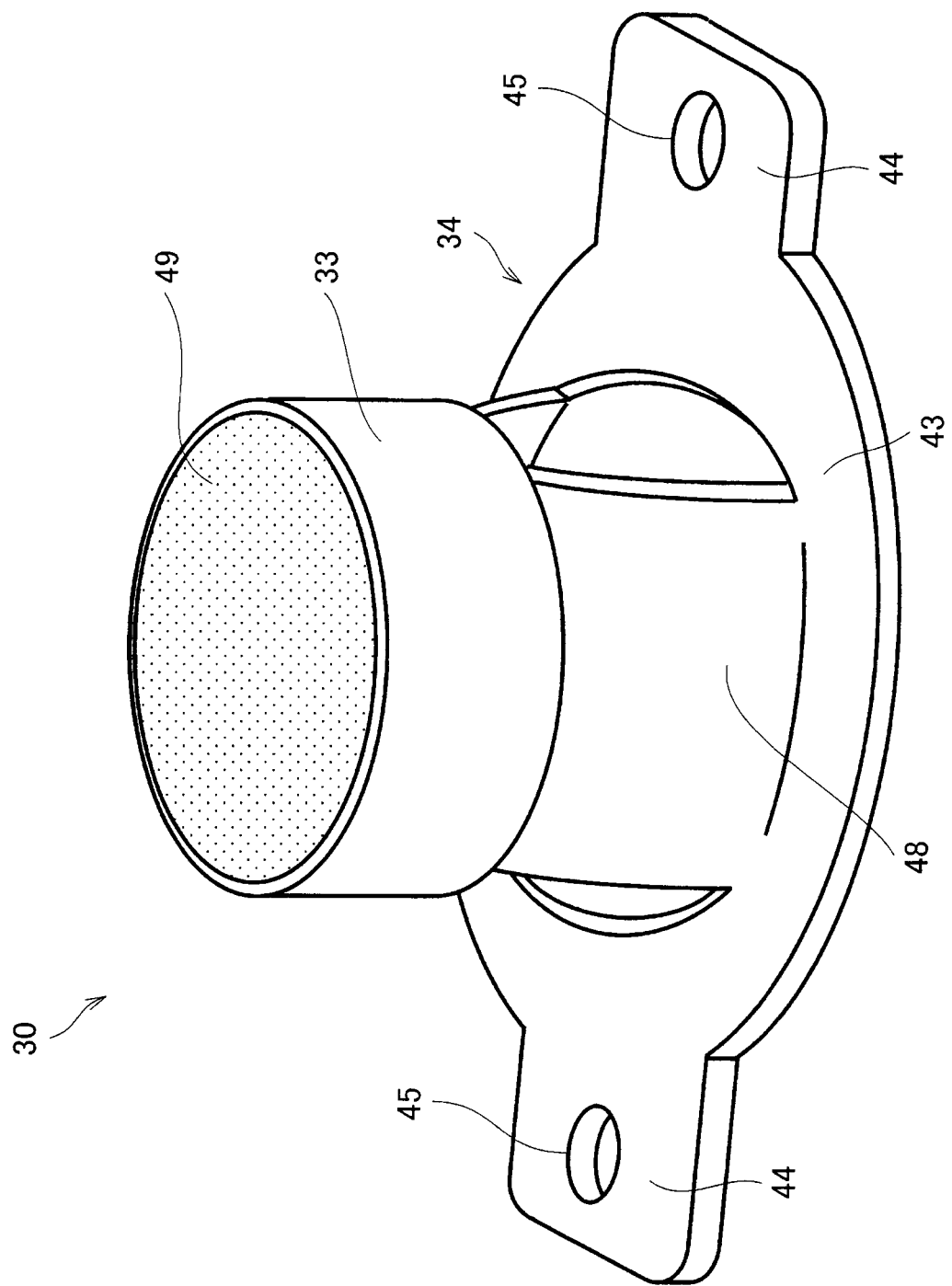
FIG. 11 is a perspective view including the attracting element when the flat spring of FIG. 10 is in the deformed state.

FIG. 11 is a perspective view including the attracting element 33 when the flat spring 34 of FIG. 10 is in the deformed state. The attracting element 33 is fixed to the flat spring 34 via the through-hole 47, by a fastening member such as a screw.

The attracting element 33 is formed of a ferromagnetic body, such as carbon steel S25C. A buffer plate 49 is fixed to the contact surface of the attracting element 33 that contacts the magnet unit 31. The hardness of the buffer plate 49 is less than that of the material forming the contact surface of the magnet unit 31. For example, the material of the buffer plate may be a Si-type material or a resin material.

The buffer plate 49 is preferably configured to be replaceable on the attracting element 33. The buffer plate 49 contacts the contact surface of the magnet unit 31 and receives a focused stress, particularly when protruding portions such as the spherical protrusions 41 or the linear protrusions 50 are provided. Therefore, a depression or scraping can occur in the buffer plate 49 as a result of the buffer plate 49 absorbing the impact. Therefore, the buffer plate 49 is replaced for every prescribed number of uses. The buffer plate 49 is fixed by engaging with a recessed portion provided in the attracting element 33 or by using an adhesive agent, for example.

In the above description, the support section 35 of the magnet unit 31 is provided with protruding portions such as the spherical protrusions 41, and buffer plates 49 are provided on the attracting element 33 facing the protruding portions. However, the magnet unit 31 and the attraction unit 30, which are respectively the engaging member and the engagement receiving member, are in a relative relationship, and therefore the protruding portions and the buffer plates 49 may each be formed on the opposite unit.

An example of this is provided in FIG. 12, which is a perspective view in which the spherical protrusions 41 are arranged on the attracting element 33. In the same manner as the example in which the spherical protrusions 41 are provided on the support section 35 of the magnet unit 31, at least three spherical protrusions 41 are embedded by being pressed in fixing members 42, which are brass rings, for example. As another example, the spherical protrusions 41 may be formed integrally with the attracting element 33 by using machining such as polishing. With this configuration, the buffer plate 49 is instead provided on the support section 35 of the magnet unit 31.

It should be noted that even if the positions of the protruding portions and the buffer plates 49 are reversed, the contact surfaces of the attracting element 33 and the magnet unit 31 in the gravitational direction are still positioned to be below the bonding surfaces of the second substrate 17 and the first substrate 16. The contact surfaces are preferably positioned below the first substrate 16 holding surface of the first substrate holder 14.

Figure 13:
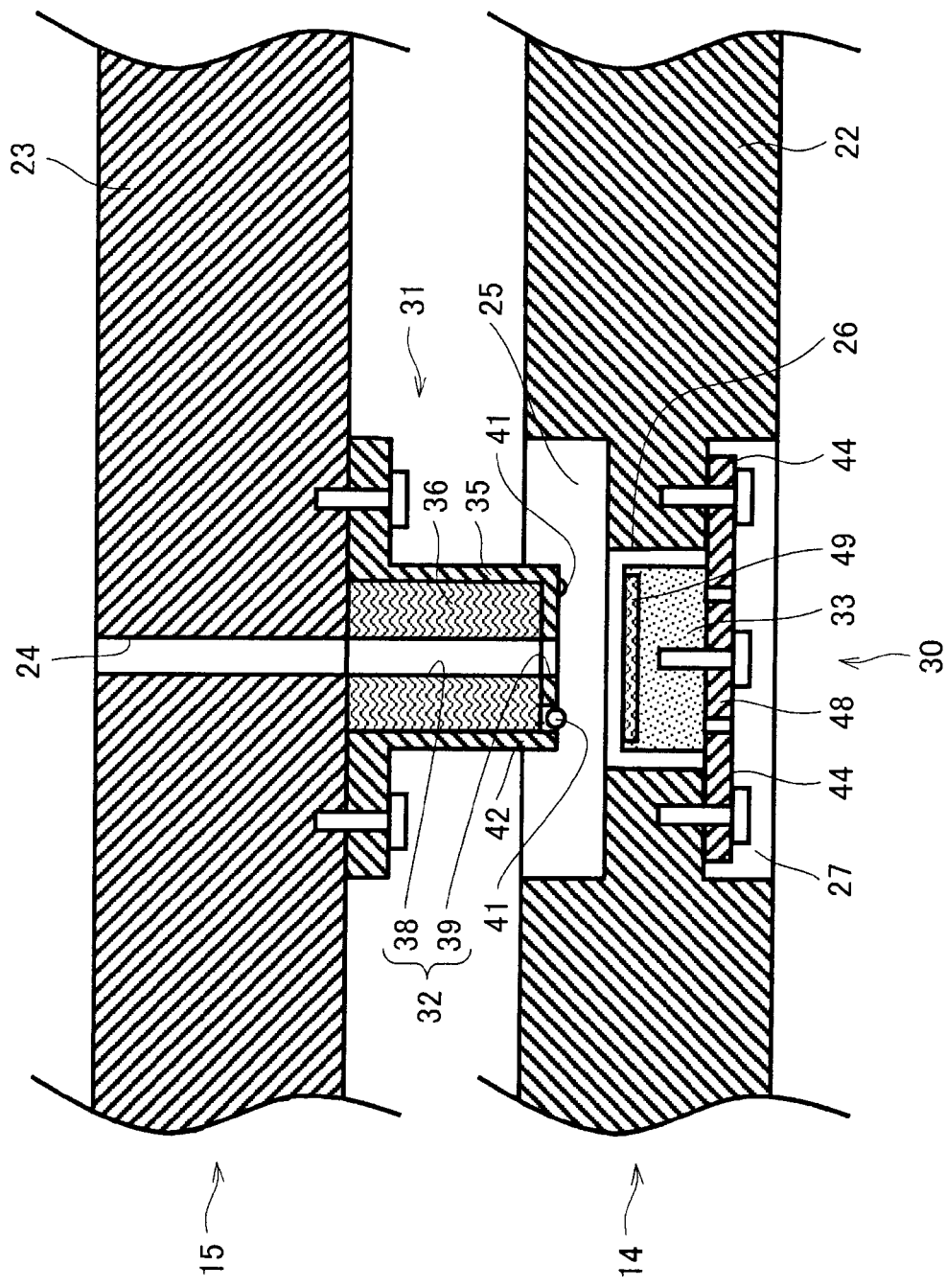
FIG. 13 is a cross-sectional view showing the coupling operation between the magnet unit and the attraction unit.
Figure 14:
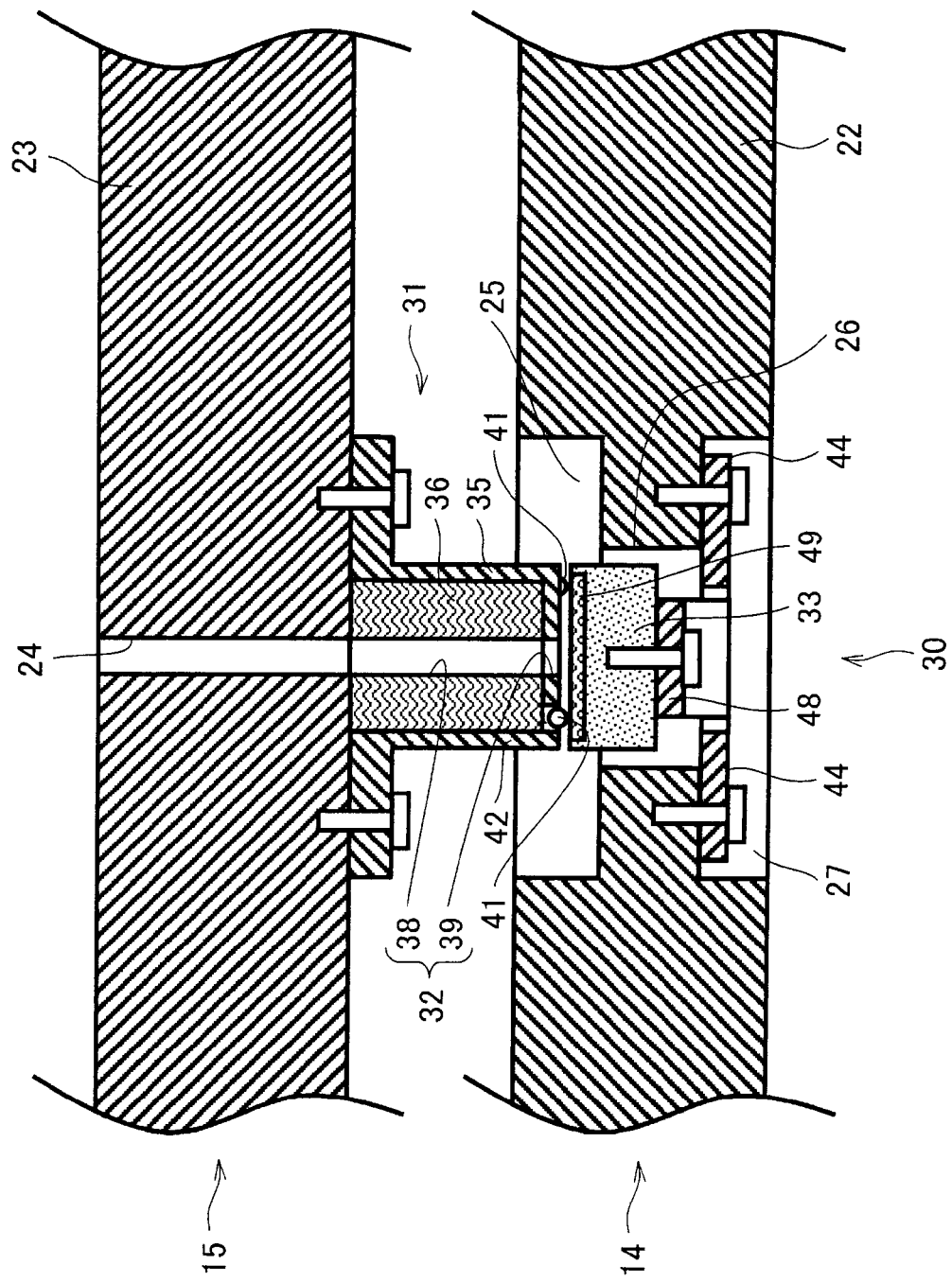
FIG. 14 is a cross-sectional view showing the coupling operation between the magnet unit and the attraction unit.

FIG. 13 is a cross-sectional view showing the coupling operation between the magnet unit 31 and the attraction unit 30. In particular, FIG. 13 shows a cross section over the line B-B in FIGS. 3 and 4. The first substrate 16, the second substrate 17, the push pin 54, etc. are omitted from the drawing. FIG. 13 shows a state before the attracting element 33 engages with the magnet unit 31. FIG. 14 shows a state after the attracting element 33 has engaged with the magnet unit 31, using the same cross-sectional view as FIG. 13.

As shown in the drawings, the magnet unit 31 is fixed to the surface of the second substrate holder 15 by a screw. The flat surface that contacts the buffer plate 49, which is the contact surface of the attracting element 33, is the virtual flat surface formed by the peaks of the spherical protrusions 41. This virtual flat surface is positioned below the first substrate 16 holding surface of the first substrate holder 14.

In other words, the first substrate holder 14 includes a recessed portion 25 having a surface that is lower than the first substrate 16 holding surface and corresponding to the region in which the attraction unit 30 is provided. The virtual surface formed by the peaks of the spherical protrusions 41 is positioned within the recessed portion 25 when the surface of the first substrate 16 contacts the surface of the second substrate 17.

The recessed portion 25 includes a through-hole 26 that allows the attracting element 33 to move up and down. The back surface of the first substrate holder 14, which is the side opposite the surface holding the first substrate 16, includes a recessed portion 27 around the through-hole 26, and the flat spring 34 and a screw fixing the flat spring 34 to the first substrate holder 14 are arranged to be housed within the recessed portion.

As shown by the change from the state of FIG. 13 to the state of FIG. 14, the band-shaped portion 48 to which the attracting element 33 is affixed elastically deforms as a result of the attracting element 33 being attracted by the magnet 36. At this time, the attaching sections 44 are fixed to the first substrate holder 14, and therefore the flat spring 34 biases the first substrate holder 14 and the second substrate holder 15 to draw closer to each other, by sandwiching the second substrate 17 with the first substrate 16.

FIG. 15 is a cross-sectional view schematically showing the engagement control unit 53. A plurality of engagement control units 53 are arranged on the second substrate holder 15, corresponding to the magnet units 31. The cylinder portion 55 is connected to an air pump 56 that adjusts the atmospheric pressure within the cylinder portion 55. The control section causes the push pin 54 to extend and retract by controlling the air pump 56. More specifically, the control section causes the push pin 54 to be at the stored position in which at least a portion of the push pin 54 is within the cylinder portion 55 or at the extended position in which the tip 57 of the push pin 54 presses the buffer plate 49. Accordingly, the pressing force exerted by the push pin 54 on the buffer plate 49 is large enough to resist the elastic force of the flat spring 34.

The tip 57 of the push pin 54 is machined to be spherical, in order to achieve point contact with the buffer plate 49. As another example, a tip portion such as a spherical protrusion 41 may be provided as a separate member.

Figure 16:
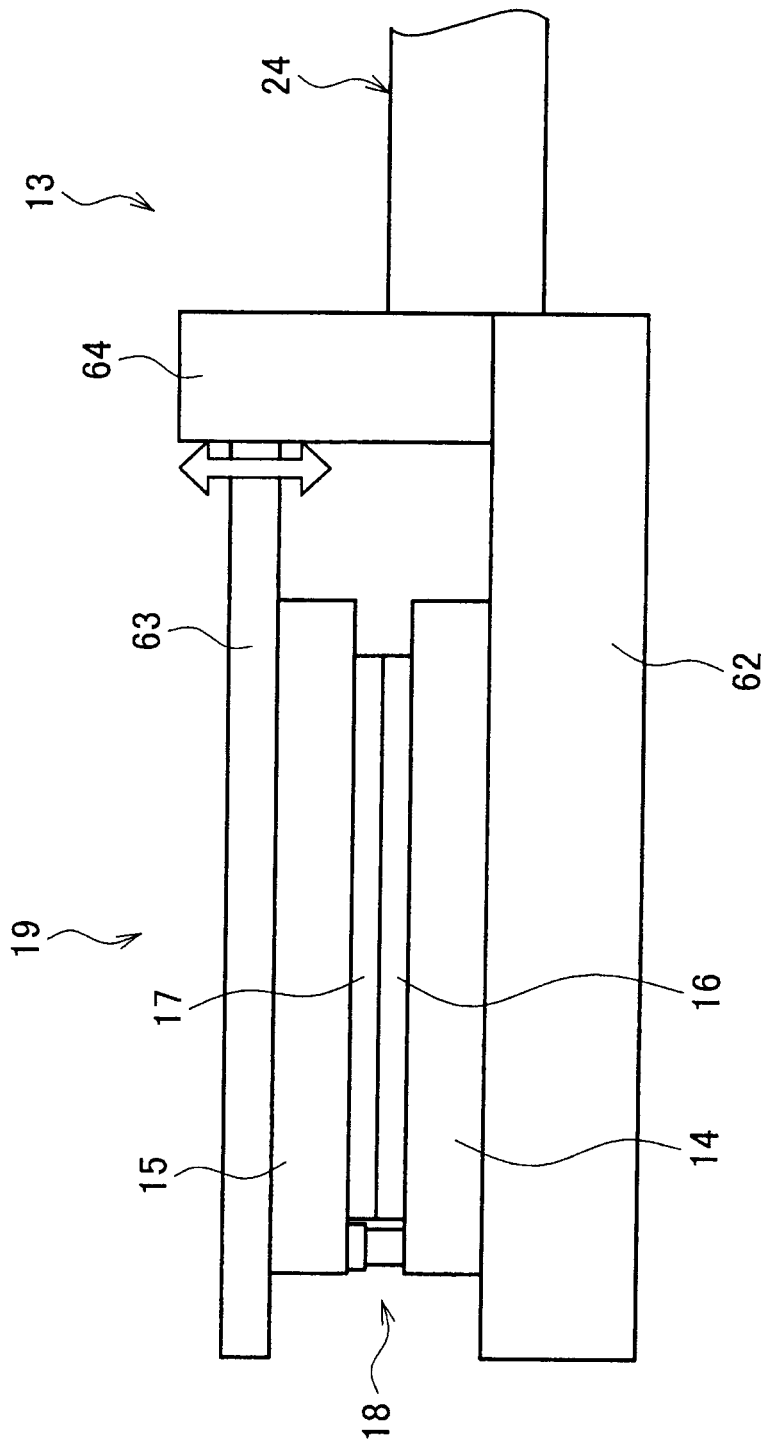
FIG. 16 is a side view schematically showing a state in which the transport apparatus grips the substrate holder pair.

FIG. 16 is a side view schematically showing a state in which the transport apparatus 13 grips the substrate holder pair 18. The transport apparatus 13 includes an arm portion 20 and a gripping section 19 that is connected to the arm portion 20. The gripping section 19 includes a support board 62 that supports the substrate holder pair 18 from below and a presser plate 63 that presses the substrate holder pair 18 from above. The support board 62 includes a suction hole that fixes the substrate holder pair 18 thereto using vacuum suction, and the substrate holder pair 18 is fixed to the support board 62 as a result of this suction.

The presser plate 63 is provided on a support column 64 formed on one end of the support board 62, and can move back and forth in a direction to sandwich the substrate holder pair 18. The presser plate 63 exerts a pressing force on the substrate holder pair 18 fixed to the support board 62, such that the substrate holder pair 18 can be sandwiched by the presser plate 63 and the support board 62. As a result of the arm portion 20 moving while in this state, the transport apparatus 13 transports the substrate holder pair 18 from the alignment apparatus 11 to the bonding apparatus 12.

Figure 17:
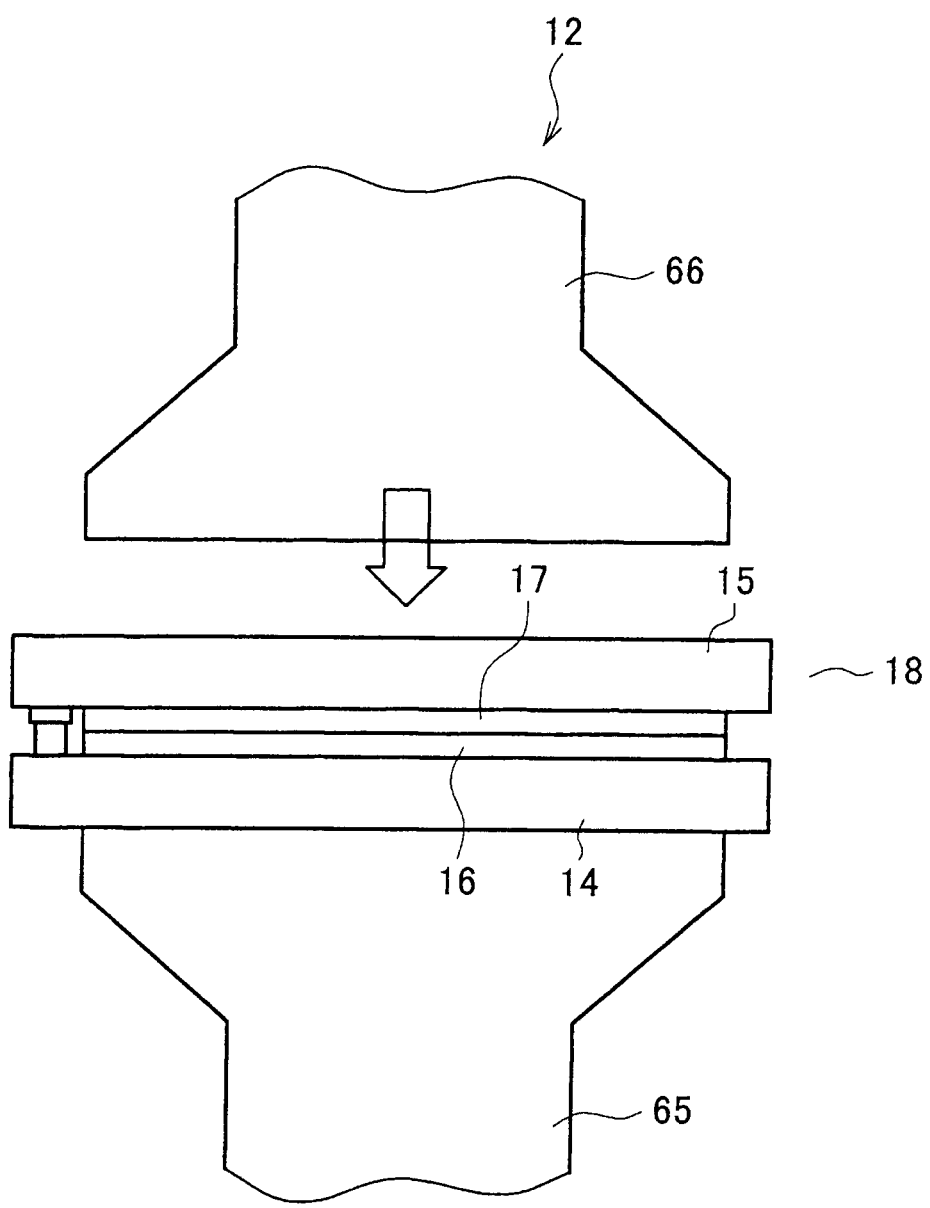
FIG. 17 is a side view schematically showing essential portions of the bonding apparatus.

FIG. 17 is a side view schematically showing essential portions of the bonding apparatus 12. The bonding apparatus 12 includes a lower pressuring stage 65 arranged below the first substrate holder 14 and an upper pressuring stage 66 arranged above the second substrate holder 15. The upper pressuring stage 66 can move toward the lower pressuring stage 65, in order to apply pressure to the substrate holder pair 18 together with the lower pressuring stage 65. The lower pressuring stage 65 and the upper pressuring stage 66 each house a heater therein, and can therefore also apply heat to the substrate holder pair 18 mounted thereon in addition to applying pressure. As a result of the pressure and heat being applied to the substrate holder pair 18, the electrodes of the first substrate 16 and the second substrate 17 in contact with each other are fused together. As a result, the corresponding circuit regions 21 of the first substrate 16 and the second substrate 17 are bonded together.

In the embodiment described above, the buffer plate 49 is provided on at least one of the magnet unit 31 and the attracting element 33. However, since the buffer plate 49 functions to restrict dust when the magnet unit 31 contacts the attracting element 33, the buffer plate 49 may be shaped as something other than a plate. In other words, it is only necessary that a buffer portion be provided on the contact portion of at least one of the magnet unit 31 and the attracting element 33.

The buffer portion is formed with a hardness different from that of the component being contacted, in order to restrict dust when the magnet unit 31 and the attracting element 33 contact each other. In other words, regardless of whether the buffer portion side is softer than the component being contacted or harder than the component being contacted, the buffering component can sufficiently function as a buffer portion if the surface of the component being contacted is not scratched and the surface of the buffer portion itself is not chipped. Accordingly, instead of being formed as a plate, the buffer portion may be formed by coating the contact portion with a buffering material, for example. The material for the coating may be a Si material or resin material, as described above. When the buffer portion is formed by a coating material, the coating material can be applied to the protruding portions, such as the spherical protrusions 41 described above, that serve as the contact portions, without forming a flat surface.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A substrate holder system comprising:
a first substrate holder including a first surface which holds a first substrate;
an engaging member provided on the first substrate holder, the engaging member including a first contact portion;
a second substrate holder including a second surface which holds a second substrate and can, together with the first substrate holder, sandwich the first substrate and the second substrate; and
an engagement receiving member that is provided on the second substrate holder and engages with the engaging member, the engagement receiving member including a second contact portion;
wherein, during engagement of the engaging member and the engagement receiving member, at least one of the first contact portion and second contact portion is below the lower of the first surface and the second surface, the at least one of the first contact portion and second contact portion being within a cavity surrounding the lower of the first contact portion and the second contact portion.

2. The substrate holder system according to claim 1, further comprising a coating material applied to at least one of the first contact portion and the second contact portion.

3. The substrate holder system according to claim 1, wherein one of the first contact portion and the second contact portion is provided with a protruding portion to achieve point contact or linear contact with at least one of the first contact portion and the second contact portion.

4. The substrate holder system according to claim 2, wherein a hardness of the coating material differs from the hardness of the one of the first contact portion and the second contact portion to which the coating material is not applied.

5. The substrate holder system according to claim 2, wherein the coating material includes one of a Si-type material and a resin-type material.

6. The substrate holder system according to claim 1, further comprising a buffer plate provided on at least one of the first contact portion and the second contact portion.

7. The substrate holder system according to claim 6, wherein a hardness of the buffer plate is different from the hardness of the one of the first contact portion and the second contact potion that does not include the buffer plate.

8. The substrate holder system according to claim 6, wherein the buffer plate includes one of a Si-type material and a resin-type material.

9. The substrate holder system according to claim 6, wherein the one of the first contact portion and the second contact portion that does not include the buffer plate is provided with a protruding portion that achieves point contact or linear contact with the buffer plate.

10. The substrate holder system according to claim 9, wherein the protruding portion is at least three spherical members.

11. The substrate holder system according to claim 6, wherein the buffer plate can be detached from the one of the first contact portion and the second contact portion including the buffer plate.

12. A substrate holder comprising:
a holder body including a holder surface which holds a first substrate; and
a fixing section that fixes the first substrate to a second substrate to be bonded to the first substrate in a stacked state, the fixing section including a first contact portion and a second contact portion that engages with the first contact portion;
wherein at least one of the first contact portion and the second contact portion is below the holder surface, the at least one of the first contact portion and second contact portion being within a cavity surrounding the lower of the first contact portion and the second contact portion.

13. The substrate holder according to claim 12, wherein the fixing section includes one of an engaging member provided on the holder body and an engagement receiving member that fixes the first substrate and the second substrate to each other by engaging with the engaging.

14. The substrate holder according to claim 12, wherein a protruding portion is provided to the first contact portion in a manner to achieve point contact or linear contact with the second contact portion.

15. The substrate holder according to claim 12, wherein a coating material applied to at least one of the first contact portion and the second contact portion includes one of a Si-type material and a resin-type material.

16. The substrate holder according to claim 12, further comprising a buffer plate provided on the second contact portion.

17. The substrate holder according to claim 16, wherein a hardness of the buffer plate is different from a hardness of the first contact portion.

18. The substrate holder according to claim 16, wherein the buffer plate includes one of a Si-type material and a resin-type material.

19. The substrate holder according to claim 16, wherein the first contact portion is provided with a protruding portion that achieves point contact or linear contact with the buffer plate.

20. The substrate holder according to claim 19, wherein the protruding portion includes at least three spherical members.

21. The substrate holder according to claim 16, wherein the buffer plate can be detached from the first contact portion.

22. A fixing mechanism comprising:
a fixing section that fixes a first substrate to a second substrate, which is to be bonded to the first substrate, in a stacked state, the fixing section including a first contact portion and a second contact portion that engages with the first contact portion;
wherein at least one of the first contact portion and the second contact portion is below both of the first substrate and the second substrate, the at least one of the first contact portion and second contact portion being within a cavity surrounding the lower of the first contact portion and the second contact portion.

23. A substrate bonding apparatus comprising the substrate holder according to claim 12.

24. A substrate bonding apparatus comprising:
a holder body including a holder surface which holds a first substrate;
a fixing section that fixes the first substrate to a second substrate, which is to be bonded to the first substrate, in a stacked state, the fixing section including a first contact portion and a second contact portion that engages with the first contact portion; and
a bonding section that bonds the first substrate to the second substrate;
wherein at least one of the first contact portion and the second contact portion is below the holder surface, the at least one of the first contact portion and second contact portion being within a cavity surrounding the lower of the first contact portion and the second contact portion.

25. A substrate bonding apparatus comprising:
a fixing section that fixes a first substrate to a second substrate in a stacked state, the fixing section including a first contact portion and a second contact portion that engages with the first contact portion; and
a bonding section that bonds the first substrate to the second substrate;
wherein at least one of the first contact portion and the second contact portion is below both of the first substrate and the second substrate, the at least one of the first contact portion and second contact portion being within a cavity surrounding the lower of the first contact portion and the second contact portion.

26. A device manufacturing method comprising:
mounting a first substrate on a holder surface of a substrate holder, the substrate holder including a fixing section that fixes the first substrate to a second substrate to be bonded to the first substrate in a stacked state, the fixing section including a first contact portion and a second contact portion that engages with the first contact portion, wherein at least one of the first contact portion and the second contact portion is below the holder surface, the at least one of the first contact portion and second contact portion being within a cavity surrounding the lower of the first contact portion and the second contact portion;
stacking the second substrate on the first substrate mounted on the substrate holder; and
fixing the first substrate and the second substrate using the fixing section.

27. The substrate holder system according to claim 1, wherein the cavity is located along a perimeter of the substrate holder.

28. The substrate holder according to claim 12, wherein the cavity is located along a perimeter of the holder body.

29. The fixing mechanism according to claim 22, wherein the cavity is located along a perimeter of a substrate holder.

30. The substrate bonding apparatus according to claim 24, wherein the cavity is located along a perimeter of the holder body.

* * * * *